(12) United States Patent
Zhang

(10) Patent No.: US 8,171,622 B2
(45) Date of Patent: May 8, 2012

(54) FLEXIBLE PRINTED CIRCUIT AND METHOD FOR MANUFACTURING THE SAME

(75) Inventor: Hua Zhang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 807 days.

(21) Appl. No.: 12/091,042

(22) PCT Filed: Jul. 28, 2006

(86) PCT No.: PCT/CN2006/001886
§ 371 (c)(1),
(2), (4) Date: Sep. 8, 2008

(87) PCT Pub. No.: WO2007/048300
PCT Pub. Date: May 3, 2007

(65) Prior Publication Data
US 2009/0145632 A1  Jun. 11, 2009

(30) Foreign Application Priority Data
Oct. 25, 2005  (CN) .......................... 2005 1 0021963

(51) Int. Cl.
*H05K 3/20* (2006.01)
(52) U.S. Cl. .............. 29/831; 29/830; 29/846; 174/254
(58) Field of Classification Search ..................... 29/851
See application file for complete search history.

(56) References Cited

U.S. PATENT DOCUMENTS

| 4,517,044 A | * | 5/1985 | Arnold ........................... 156/277 |
| 4,659,872 A | * | 4/1987 | Dery et al. .................. 174/117 A |
| 4,753,838 A | * | 6/1988 | Kimura et al. ................... 428/91 |
| 5,417,044 A | * | 5/1995 | Russo ........................ 56/400.11 |
| 6,168,855 B1 | | 1/2001 | Cohen et al. |
| 6,378,199 B1 | * | 4/2002 | Yoshinuma et al. ............ 29/830 |
| 6,781,056 B1 | * | 8/2004 | O'Rourke et al. ............. 174/535 |
| 2002/0165440 A1 | * | 11/2002 | Mason et al. ................. 600/344 |
| 2005/0208708 A1 | | 9/2005 | Jiao et al. |

FOREIGN PATENT DOCUMENTS

EP  0 490 530  6/1992

(Continued)

OTHER PUBLICATIONS

JP 2003-298285 English translation.*
PCT International Search Report for PCT Counterpart Application No. PCT/CN2006/001886 containing Communication relating to the Results of the Partial International Search Report, 4 pgs., (Nov. 23, 2006).

(Continued)

*Primary Examiner* — Tuan T Dinh
*Assistant Examiner* — Steven Sawyer
(74) *Attorney, Agent, or Firm* — Blakely, Sokoloff, Taylor & Zafman LLP.

(57) ABSTRACT

Disclosed is a flexible printed circuit, comprising a substrate, and a silver foil and a reinforcement plate attached on said substrate in order, wherein there is an ink layer between said silver foil and said reinforcement plate. According to the invention, by printing the ink onto the silver foil and then attaching the reinforcement plate, especially printing the ink in the form of a dot, strip or mesh, the total thickness of the flexible printed circuit will not increase while the surface roughness of the silver foil increases, resulting in increase of adhesion of the reinforcement plate. This strengthens the attachment between the reinforcement plate and the silver foil, meeting the requirement of peeling-resistant strength between the reinforcement plate and the silver foil.

3 Claims, 1 Drawing Sheet

FOREIGN PATENT DOCUMENTS

| | | |
|---|---|---|
| EP | 1 335 642 | 8/2003 |
| JP | 5024145 A | 2/1993 |
| JP | 7245494 A | 9/1995 |
| JP | 2003298285 A | 10/2003 |
| JP | 2004 095566 | 3/2004 |
| WO | WO 01/86641 | 11/2001 |

OTHER PUBLICATIONS

Supplementary European Search Report for counterpart EP counterpart application No. EP 06 76 1598, 8 pgs., (Oct. 14, 2008).

First Examination Report for EP counterpart application No. EP 06 76 1598, 5 pgs., (Jun. 30, 2009).

* cited by examiner

FLEXIBLE PRINTED CIRCUIT AND METHOD FOR MANUFACTURING THE SAME

CROSS-REFERENCE TO OTHER APPLICATIONS

This is a National Phase of International Application No. PCT/CN2006/001886 filed on Jul. 28, 2006, which claims priority from Chinese Patent Application No. 200510021963.0 filed on Oct. 25, 2005, the disclosure of which is incorporated herein by reference in its entirety.

TECHNICAL FIELD

The invention relates to a flexible printed circuit (FPC) and a method for manufacturing such a flexible printed circuit.

BACKGROUND

As well known, while various electronic devices tend to minimization and light weight, they are also developing to multifunction and high speed. Electromagnetic waves with various frequencies will be generated and radiated during operation of these electronic devices, resulting in cross interference. Thus, it is an effective measure for shielding the electronic devices to prevent the interference of electromagnetic waves. This may not only prevent the incident electromagnetic wave from interfering with electronic devices in operation, but also effectively prevent the electromagnetic wave radiated during operation of these devices from interfering with other electronic devices in operation. Under such circumstances, the requirement for application of electromagnetic wave shielding in the flexible printed circuit (FPC) used for assembly of electronic devices is increasing.

At present, methods for shielding electromagnetic waves in FPC mainly comprise:

Copper foil: in this method, copper foil is hot-pressed on FPC products for shielding electromagnetic wave. The copper foil has a better shielding effect and flexibility. However, its thickness is larger, and hot pressing should be performed more than one time. Thus, this method has a long production period and higher cost.

Silver slurry: in this method, a layer of conductive coating, such as silver slurry, is uniformly coated on the surface of FPC products by printing and the like, for shielding electromagnetic wave. This method has advantages of low cost and good flexibility. But it has disadvantages of poor shielding effect, coating peeloff easily, requirement of printing, hardening and the like, long production period.

Silver foil: in this method, a new type of shielding material, i.e. silver foil, which was developed by Japanese TATSUTA company, is used. It includes protective film layer, insulation layer, metal foil layer, anisotropic conductive adhesive layer and release layer, and has excellent shielding effect and flexibility. Furthermore, it has advantages of fewer pressing times, short production period and high production efficiency, and is widely used in FPC in recent years.

Additionally, various electronic components, such as IC, resistor and capacitor, are mounted on a FPC. The insertion portions of the FPC should have a certain level of strength and stiffness to facilitate the assembly of electronic components. This needs to attach a reinforcement plate on these portions of the FPC. The typical reinforcement plates include: epoxy resin laminated plate with glass fiber as reinforcement material, such as FR4; shaping parts of heat resistance resin, such as PI reinforcement plate; aluminum plate; stainless steel plate; or composite reinforcement materials with a stereo shape by forging these materials in molds.

The reinforcement plate is attached by a layer of adhesive. The adhesive is mainly composed of thermosetting type and pressure sensitive type. High temperature and high pressure applied by hot pressing and baking processes are needed for thermosetting adhesive to complete its adhesive effect. Thus, this involves a long operation period and a higher cost. But only pressure is needed for pressure sensitive adhesive to provide this adhesive with a level of anti-peeling strength. Therefore, it has advantages of simple operation, short period and low cost, but its anti-peeling strength is a little lower.

With the minimization of electronic products, various electronic components tend to develop to miniature and superfineness. The FPC which carries various electronic components also tends to develop to miniature, high density and multifunction. Recently, some products require an effective bonding between the reinforcement plate and the shielding material. As shown in FIG. 1, the bonding method is as follows: a pressure sensitive double faced adhesive tape 2 is attached onto a reinforcement plate 1, to bond the tape 2 and the reinforcement plate 1 together by roll pressing. At the same time, the other side of the tape 2 is covered by a layer of release paper. The release paper, which covers the other side of the tape 2, is removed before the reinforcement plate 1 is attached to a silver foil 3, and then the reinforcement plate 1 is attached to the silver foil 3 by means of the tape 2. After adhesion, pressure is applied onto the reinforcement plate 1 to bond the tape 2 and the silver foil 3 together. However, the silver foil can not bond tightly to the reinforcement plate by the tape 3 during this bonding process, since the silver foil has a very smooth layer of protective film. Accordingly, the anti-peeling strength can not meet the designed application requirement.

SUMMARY OF THE INVENTION

The primary object of the present invention is to provide a flexible printed circuit with a higher anti-peeling strength and a method for manufacturing such a flexible printed circuit, to overcome the shortage of poor anti-peeling strength in the prior art of FPC.

The FPC of the present invention comprises a substrate and a silver foil and a reinforcement plate attached on the substrate in order, wherein an ink layer is disposed between the silver foil and the reinforcement plate.

The method for manufacturing such a FPC of the present invention comprises the following steps:

A1: a silver foil is attached onto a FPC surface;

B1: an ink layer is printed onto the portion of the silver foil surface where a reinforcement plate is intended to be attached;

C1: the reinforcement plate is attached onto the ink layer.

The present invention has the following advantages. By printing the ink layer onto the silver foil and then attaching the reinforcement plate, especially printing the ink in the form of a dot, strip or mesh, the total thickness of FPC does not increase while the surface roughness of silver foil increases, resulting in the increase of adhesion of the reinforcement plate. This strengthens the attachment between the reinforcement plate and the silver foil, meeting the requirement of anti-peeling strength between the reinforcement plate and the silver foil. Furthermore, the method of the invention has advantages of low cost and easy operation.

The aspects and advantages of the present invention will become more apparent by describing embodiments thereof in detail with reference to the attached drawings.

DETAILED DESCRIPTION OF THE INVENTION

Embodiments of the invention will be now described in detail with reference to the attached drawings.

Figure 1:
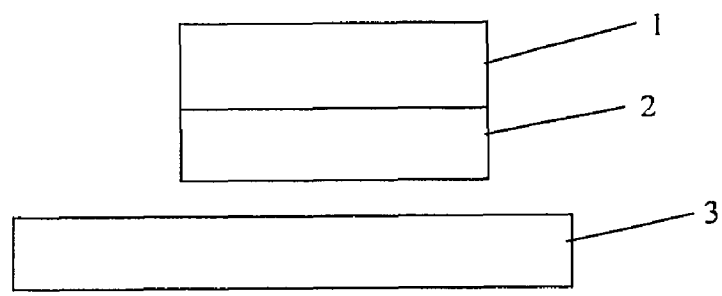
FIG. 1 is a schematic view illustrating a bonding structure between a silver foil and a reinforcement plate in the prior art.
Figure 2:
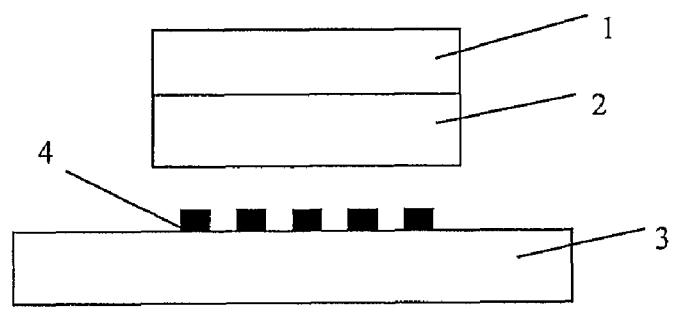
FIG. 2 is a schematic view illustrating a bonding structure between a silver foil and a reinforcement plate according to one embodiment of the invention.
Figure 3:
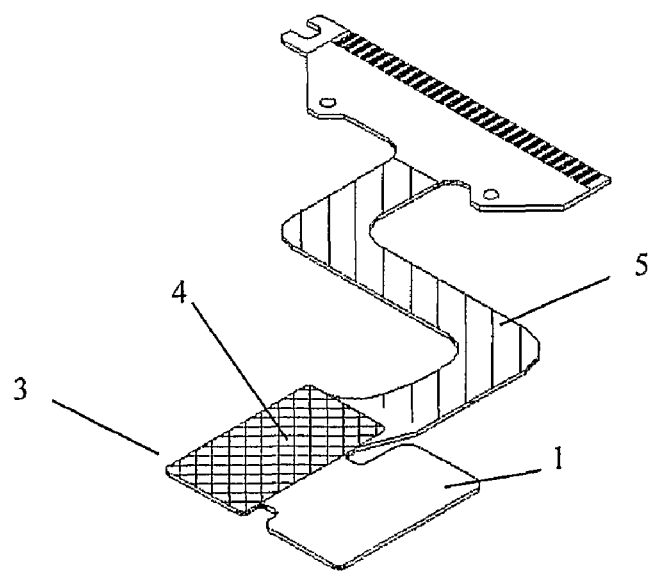
FIG. 3 is a schematic view illustrating a structure of a FPC according to one embodiment of the invention.

As shown in FIGS. 2 and 3, a FPC of the present invention comprises a substrate 5 and a silver foil 3 and a reinforcement plate 1 attached on the substrate in order, wherein an ink layer 4 is further disposed between the silver foil 3 and the reinforcement plate 1.

More particularly, the ink layer 4 is printed on the portion of the silver foil 3 where the reinforcement plate 1 is intended to be attached.

Preferably, the ink of the ink layer may be formed by mixing organic solvent and various resins, generally in the form of a viscous liquid, and has a variety of kinds with different properties. The curing mode of the ink may be divided into two classes: photosetting and thermosetting. In general, thermosetting ink has a better adhesion, and is typically used for text marks, which has an excellent wear resistance and adhesion. In case of thermosetting by baking after printing, the ink may tightly adhere on such a print carrier as the substrate, and its property can keep stable.

Thermosetting ink generally includes two components, i.e., main agent and hardener. When used, these two components are mixed together according to a ratio and then stirred uniformly. After the printing finished, the ink is baked for hardening at a temperature.

In this embodiment, the thermosetting ink is preferred. After the silver foil 3 was printed with this ink, it is put in an oven for baking to harden for a period of time, such that good adhesion is formed between the ink 4 and the silver foil 3. On the other hand, a pressure sensitive double faced adhesive tape 2 is attached on the reinforcement plate 1, to bond the tape 2 and the reinforcement plate 1 together by rolling. At the same time, the release paper, which covers the other side of the tape 2, is removed before the reinforcement plate 1 is attached to the silver foil 3, and then the reinforcement plate 1 adheres to the silver foil 3 by means of the tape 2. After adhesion, pressure is applied on the reinforcement plate 1 to bond the tape 2 and the silver foil 3 together through the ink layer 4. Herein, the ink layer 4 plays a role of bridge, i.e., the ink layer 4 is used to bond the silver foil 3 since it has a good adhesion with the silver foil 3, and then the reinforcement plate 1 is bonded to the ink layer 4 through the tape 2. The ink layer is preferably printed in the form of a dotted net. Although the process that the ink is printed into a whole layer is simple, the whole layer of ink will increase the thickness of FPC 5. The thickness of ink dot is preferably controlled in the range of 10 to 20 micrometers, and can not affect the total thickness of products. At the same time, the ratio of the area covered by the ink layer to the bonding area of the reinforcement plate should be controlled properly, preferably from 10% to 30%. Because the lower the area ratio, the smaller the dot or the lower the dot density, resulting in the decrease of the dot adhesion. On the other hand, the higher the area ratio, the bigger the dot or the higher the dot density, resulting in the increase of the total thickness of FPC 5. The ink layer may be printed in the form of a strip or mesh.

Now, the invention will be further described with reference to the embodiment of the invention and a comparative embodiment.

Embodiment

The shielding method wherein a silver foil is boned to some sections of circuit is applied in one product to prevent outside electromagnetic interference. A reinforcement plate was boned to the portion of silver foil that needs to improve the hardness and flatness, to facilitate installation. The silver foil is SP-PC1000V3 from Japanese TATSUTA company. The reinforcement plate is FR-4 from Jiantao company and its thickness is 0.2 mm. The double faced adhesive tape is type 5915 from Ridong company. According to the method of the invention, before the reinforcement plate is bonded on the silver foil 3, the silver foil was firstly printed with ink, i.e., the ink 4 was printed in the form of a dotted net on the section that needs to adhere the reinforcement plate 1. The ink is BK-3 thermoset ink from Taiwan Chuanyu company. The printed dot has a diameter of 0.45 mm and an interval of 0.9 mm, the area covered by the ink is 19.6%. After printed, the product was put in an oven for baking to harden at 135° C. for 40 min. After that, the hardened ink was bonded tightly on the surface of the silver foil. As shown in FIG. 3, the ink 4 is in the form of a dotted net. Then, type 5915 of double faced adhesive tape was attached to the reinforcement plate 1, and the reinforcement plate 1 was folded to attach to the silver foil 3. Finally, pressure was applied on the double faced adhesive tape 2 by hand, to make the reinforcement plate and the silver foil bond together tightly.

10 pieces of products were tested in a high temperature and high humidity experiment, using a high temperature and high humidity programmable tester, MHU-225CSSA from Taili instrument company. The experiment condition is as following: temperature 80° C., humidity 80%, and time 15 h.

Tested results: the peeling off of the reinforcement plate takes place only in one of the ten pieces of products. The ratio of defected product is 10%.

Comparative Embodiment

The product, material and test instrument in this comparative embodiment is the same as those in the above embodiment.

After the silver foil used for shielding was bonded on the circuit sections, the reinforcement plate was boned directly without the ink layer. 10 pieces of products were tested in a high temperature and high humidity experiment. The experiment condition is as following: temperature 80° C., humidity 80% and time 15 h.

Tested results: the peeling off of the reinforcement plate takes place in six of the ten pieces of products. The ratio of defected product is 60%.

Therefore, as compared with conventional methods, the present invention can effectively improve the adhesion between the silver foil and the reinforcement plate, and remarkably increase the anti-peeling strength between them. The present invention can not only be applied to bond between a silver foil and a reinforcement plate, but also to bond a silver foil or a copper foil with other materials. The present invention can be applied not only in a FPC, but also in other components.

What is claimed:

1. A method for manufacturing a flexible printed circuit, wherein said method comprises the following:

A1: attaching a silver foil is onto a surface of a flexible printed circuit;

B1: printing an ink layer onto a region of the silver foil surface where a reinforcement plate is intended to be attached; and C1: coupling the reinforcement plate to the ink layer, wherein the method further comprises the following operation after operation B1 and before operation C1:

attaching a pressure sensitive double faced adhesive tape onto the reinforcement plate, bonding the tape with the reinforcement plate by rolling, removing the release paper from the other side of the tape, and then adhering the reinforcement plate onto the silver foil by means of the tape; and the method further comprises the following operation after operation C1:

applying pressure on the reinforcement plate to bond the tape on the reinforcement plate with the silver foil by means of the ink layer.

2. The method according to claim 1, wherein the ink in said ink layer is in the form of a dot, a strip or a mesh;

the thickness of said ink layer is from 10 to 20 micrometers; and the coverage area of said ink layer is 10% to 30% of the area of said reinforcement plate.

3. The method according to claim 1, wherein said ink layer is formed by mixing an organic solvent with a resin.

* * * * *